United States Patent [19]

Davies et al.

[11] 4,354,165

[45] Oct. 12, 1982

[54] TIME-DELAY-TRIGGERED TRAPATT OSCILLATOR HAVING DELAY LINE WITH PROGRESSIVELY INCREASING IMPEDANCE

[75] Inventors: Robert Davies; Barrie H. Newton, both of Copthorne; Peter L. Booth, Reigate, all of England

[73] Assignee: U.S. Philips Corporation, New York, N.Y.

[21] Appl. No.: 165,892

[22] Filed: Jul. 3, 1980

[30] Foreign Application Priority Data

Jul. 16, 1979 [GB] United Kingdom ................ 7924638

[51] Int. Cl.³ ................................................ H03B 9/14
[52] U.S. Cl. .................................. 331/96; 331/107 C; 331/107 SL

[58] Field of Search ............. 331/96, 107 DP, 107 C, 331/107 SL

[56] References Cited

U.S. PATENT DOCUMENTS 3,743,966  7/1973  Grace et al. ..................... 331/107 C
3,842,370  10/1974  Fong ............................. 331/107 C Primary Examiner—Siegfried H. Grimm
Attorney, Agent, or Firm—Robert J. Kraus

[57] ABSTRACT

A time-delay triggered TRAPATT oscillator in which the delay line impedance progressively increases from the diode end to a trigger element. Thus, all reflections except those from the trigger element are negative-going and help to reduce the rise in diode voltage between trigger pulses.

4 Claims, 3 Drawing Figures

TIME-DELAY-TRIGGERED TRAPATT OSCILLATOR HAVING DELAY LINE WITH PROGRESSIVELY INCREASING IMPEDANCE

BACKGROUND OF THE INVENTION

This invention relates to a time-delay-triggered TRAPATT oscillator arrangement comprising a TRAPATT diode, a length of delay line connected across the diode and a trigger element in the form of a step transition from a high to a low impedance at the end of the delay line remote from the diode. Such an arrangement is described by W. J. Evans in "Circuits for high-efficiency avalanche-diode oscillators", I.E.E.E. Trans. MIT-17, 1060, (1969). However, it has been reported (J. E. Carroll, "The use of pseudo-transients in the solution of the Evans TRAPATT circuit", Proceedings of the 8th International MOGA Conference, Amsterdam, 1970; J. E. Carroll and R. H. Crede, "A computer simulation of TRAPATT circuits", Int. J. Electron. 32, 273 (1972)) that successful operation of this circuit depends markedly on a number of parameters, and the complexity of the circuit (which comprises series tuners in the form of transmission lines of fairly critical lengths and impedances) is a considerable hindrance to the design and construction of simple TRAPATT oscillator modules. In particular, since the Evans circuit relies for its operation upon repeated triggering of the diode by pulses reflected from the junction of the delay line and the filter, then reflections from within the filter itself or from circuit elements beyond the filter can cause unwanted, spurious triggering. As can be appreciated from FIG. 6 of the Evans paper such reflections from within the filter can be caused by large impedance mismatches between the successive portions of the filter which, in the arrangement described with reference to FIGS. 4 to 6 of the Evans paper is in the form of a coaxial line with tuning sleeves.

Thus, this conventional TRAPATT oscillator circuit suffers from the following disadvantages.

Since each transition from a high impedance to a low impedance transmission line (as one moves away from the TRAPATT diode) is capable of generating a trigger voltage from a single diode-stimulus, multiple triggering is possible. Since each of these multiple trigger pulses can compete to control the oscillation frequency, coherence requires one trigger to achieve dominance.

Little, if any, serious investigation appears to have been carried out on the practical problem of preventing the diode voltage from exceeding avalanche breakdown between trigger pulses, particularly during the transient phase of the TRAPATT mode, that is to say during the time period between the first TRAPATT pulse and the cycle in which coherence is established. Increased lumped local capacitance and a trigger-line with single impedance stop have been found to be advantageous from experience but it is likely that such voltage suppression has, in the main, been inadvertently achieved by reflections from discontinuities between low impedance and high impedance transmission lines from components between the TRAPATT diode and the radiofrequency load.

Hitherto it has been thought that TRAPATT oscillator circuits merely provided the necessary steady state impedances at the fundamental and harmonically related frequencies, but in practice it is thought that it also provided the voltage-steps for suppressing the diode voltage between trigger pulses. Thus, to achieve coherence to accommodate this unanticipated role the many elements of the Evans circuit almost always require empirical adjustment. Failure to prevent the diode voltage exceeding avalanche breakdown between triggers will lead to different diode states prior to each trigger pulse and hence preclude coherence.

SUMMARY OF THE INVENTION

The object of this invention is two fold: first to inhibit unwanted triggering by reflections from discontinuities and thus to increase the effectiveness of the single trigger reflection from the high-to-low impedance step at the end of the transmission line, and secondly to suppress the diode voltage during the recovery period in the transient phase.

According to the invention a time-delay-triggered TRAPATT oscillator arrangement comprises a TRAPATT diode, a length of delay line connected across the diode and a trigger element in the form of a step transition from a high to a low impedance at the end of the delay line remote from the diode, and is characterised in that the delay line impedance increases progressively from a lower impedance at the end nearer to the diode to a higher impedance at the end remote from the diode.

The delay line may be stepped that is to say it may comprise a plurality of sections of increasing impedance from the diode end.

Alternatively it may be tapered that is to say its impedance increases smoothly from the diode end.

Alternatively it may be partly stopped and partly tapered.

Where the arrangement is in coaxial form the stepping and/or tapering may be applied to the inner conductor or the outer conductor or both.

BRIEF DESCRIPTION OF THE DRAWING

Embodiments of the invention will now be described by way of example with reference to the diagrammatic drawing in which.

DESCRIPTION OF THE PREFERRED EMBODIMENTS

Figure 1:
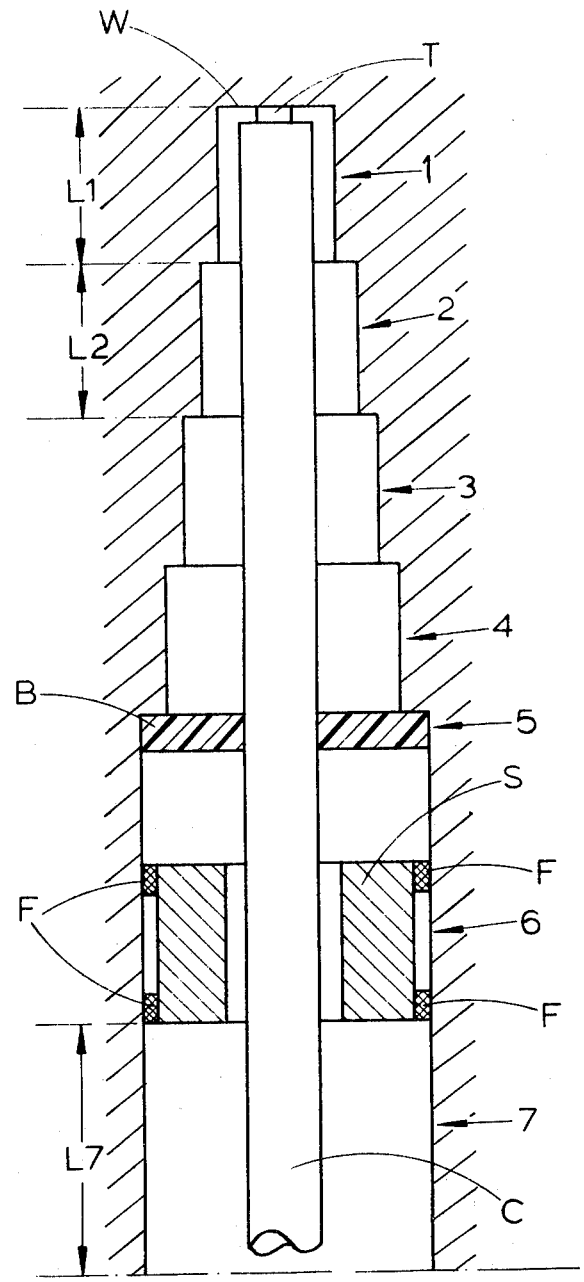
FIG. 1 illustrates a coaxial form of stepped delay line oscillator.

Referring to FIG. 1, which is not drawn to scale, a TRAPATT oscillator arrangement comprises a center conductor C of constant diameter and an outer conductor, of which the Figure shows diagrammatically only the outline of the inner surface, which is of stepped formation and can conveniently be regarded as being formed of sections 1, 2 ... 7 respectively of lengths L1, L2 ... L7 having respective characteristic impedances, not indicated on the Figure, Z 1, Z 2 ... Z 7.

At the upper end as viewed in the Figure this coaxial system is terminated by a transverse wall W between which and the end of the central conductor C is a TRAPATT diode T.

The delay line, the length of which primarily determines the frequency of oscillation, and from the end of which remote from the diode T are reflected the pulses which act as trigger pulses, is formed of the sections 1 to 5 inclusive, while the step transition from high to low impedance at the junction of sections 5 and 6 forms a trigger element which reflects part of the pulse from the diode T back along the line to trigger the next pulse.

Beyond the section 6 is a further section 7 which forms the output section of the oscillator arrangement and to which the load and the bias circuits for the diode would be coupled in the usual way. The length of this section is, of course, immaterial provided that the termination is a broad-band match that is to say a constant resistance network for example such as that disclosed in British Application No. 79-17969 filed May 23, 1979, corresponding to U.S. Pat. application No. 151,218, filed May 19, 1980.

It will be appreciated that because the high-to-low impedance transition between sections 5 and 6 is the only one of its kind, then this is the only one in the oscillator arrangement which would invert the negative-going pulse from the diode so that a positive-going trigger pulse is returned down the delay line to the diode. Because all the other impedance transitions are low-to-high, reflections of the diode pulse are not inverted but are returned as a series of negative-going pulses which act to inhibit or suppress the rise in the diode voltage between trigger pulses and thus to stabilize the effect of the trigger pulses reflected at the trigger element formed by the impedance transition 5-6.

Section 5 of the arrangement carries a polystyrene washer B some 3 mm long which is a good fit in the outer conductor and over the inner conductor C. The reason for providing this washer is purely mechanical, to add strength to the assembly.

Section 6 of the arrangement was in the form of a brass slug S of annular cross section slidable within the continuous inner surface of sections 5 and 7 and having spring contact fingers F which engage this surface: this enabled the length of section 5, and hence the fundamental frequency of oscillation to be varied. It was found that by the use of this construction the fundamental frequency could be varied between the approximate limits of 1.8 to 2.5 GHz while at the same time maintaining coherence.

Examples and dimensions of some embodiments in coaxial line will now be given with reference to FIG. 1. In all examples the center conductor C was 3 mm in diameter: in the following examples d is the inner diameter of the outer conductor. The frequency was 2.5 GHz in all cases and operation was pulsed with a duty cycle of 0.1%.

EXAMPLE 1

| Section | Z(ohms) | L(mm) | d(mm) |
|---------|---------|-------|-------|
| 1 | 10 | 15 | 3.5 |
| 2 | 15 | 9 | 4 |
| 3 | 20 | 9 | 4.2 |
| 4 | 30 | 9 | 5.0 |
| 5 | 50 | 8 | 7 |
| 6 | 10 | 13.5 | 3.5 |
| 7 | 50 | | 7 |

In this Example the mean current drawn by the diode during the pulse could be varied from about 2 amps to at least 4 amps and at the latter current a peak output power of 40 watts was reached.

EXAMPLE 2

Dimensions were as for Example 1 except that section 6 was 9 mm long. The output power was some 45 watts with an input pulse current of 4 amps.

EXAMPLE 3

Dimensions were as for Example 2 except that L2 was 9 mm and Z2 was 20 ohms so that in effect this was a four section line instead of a five-section line as in FIG. 1, since sections 2 and 3 of FIG. 1 were identical. This arrangement could only be driven up to 3.7 amps mean current during the pulse, but output powers of up to 50 watts were attained.

EXAMPLE 4

| Section | Zohms | Lmm |
|---------|-------|-----|
| 1 | 10 | 6 |
| 2 | 15 | 18 |
| 3 | 20 | 9 |
| 4 | 30 | 9 |
| 5 | 50 | 9 |
| 6 | 10 | 9 |
| 7 | 50 | |

Output powers of some 60 watts were attained with this arrangement, again with an input pulse current of 4 amps.

EXAMPLE 5

Dimensions were the same as for Example 4 except that Section 1 was 9 mm long and was loaded with a cross-linked polystyrene slug some 2 mm long, and peak outputs of over 60 watts were attained.

EXAMPLE 6

A fixed-frequency oscillator at 2.5 GHz was made to the same dimensions as those of Example 2 with the difference that the brass slug S forming the low-impedance section L6 was omitted and instead the center conductor C was formed with a portion 9 mm long and having an increased diameter of 6 mm.

Figures 2, 3:
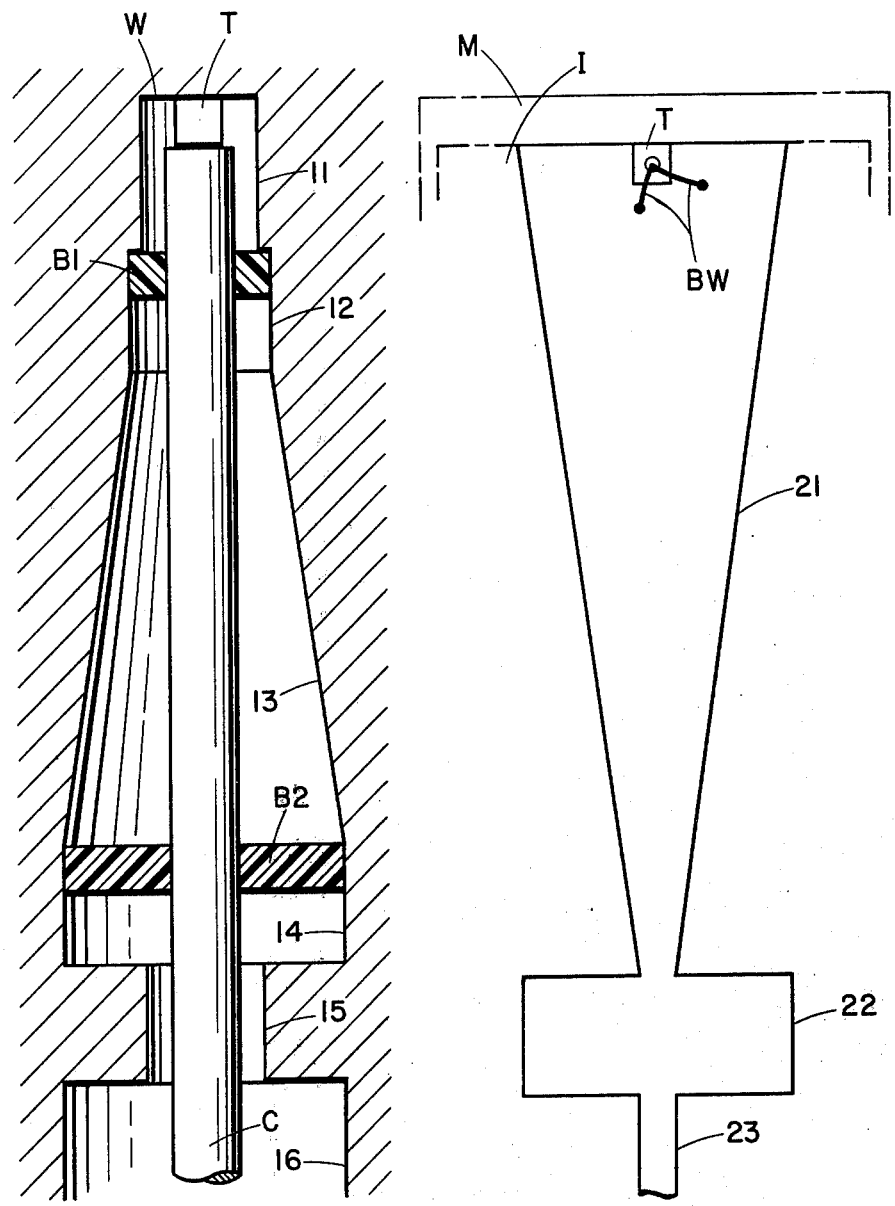
FIG. 2 illustrates a coaxial form of partly stepped and partly tapered delay line TRAPATT oscillator.
FIG. 3 illustrates a microstrip form of tapered delay line TRAPATT oscillator.

FIG. 2 illustrates an embodiment of the partly stepped and partly tapered delay line, in coaxial form. This delay line comprises TRAPATT diode T, transverse wall W, center conductor C, constant impedance sections 11, 12, 14, 15, 16, tapered impedance section 13 and polystyrene washers B1, B2.

Although the embodiments described above are all in coaxial line configuration it will of course be understood that the techniques discussed in this specification are equally applicable to other forms of transmission line such as for example stripline.

FIG. 3 illustrates an embodiment of the tapered delay line, in stripline form. This delay line comprises a TRAPATT diode T and an insulating layer I on a metallic ground plane M. One contact of the diode is directly connected to the ground plane M while the other contact is electrically-connected by wires BW to a strip conductor on the layer I, having tapered impedance section 21 and constant impedance sections 22 and 23.

We claim:

1. A time-delay-triggered TRAPATT ocillator arrangement comprising a TRAPATT diode electrically-connected across one end of a length of delay line, said delay line having a progressively increasing impedance followed by a step decrease in impedance, as distance from the diode increases, said step decrease forming a trigger element for the diode.

2. An arrangement as claimed in claim 1 characterised in that the delay line is a tapered line.

3. An arrangement as claimed in claim 1 characterised in that the delay line is a stepped line.

4. An arrangement as claimed in claim 1 characterised in that the delay line is partly stepped and partly tapered.

* * * * *